(12) United States Patent
Ranmuthu (10) Patent No.: US 6,856,195 B2
(45) Date of Patent: Feb. 15, 2005

(54) PREAMPLIFIER SYSTEM WITH SELECTABLE INPUT IMPEDANCE

(75) Inventor: Indumini Ranmuthu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 7 days.

(21) Appl. No.: 10/178,157

(22) Filed: Jun. 24, 2002

(65) Prior Publication Data

US 2003/0234685 A1 Dec. 25, 2003

(51) Int. Cl.[7] .............................................. H03F 3/45
(52) U.S. Cl. ............................ 330/86; 330/69; 360/46
(58) Field of Search ........................... 330/69, 86, 260, 330/282; 360/46, 67, 68

(56) References Cited

U.S. PATENT DOCUMENTS 6,538,833 B2 * 3/2003 Choi ........................... 360/46

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

Systems and methods are provided for selecting an input impedance of a preamplifier device. Multiple feedback paths are provided to an amplifier device of the preamplifier. The feedback paths are selectable to switch feedback paths in and out to configure the preamplifier to the desired input impedance. The desired input impedance is selected to match the input impedance of the input signal system to optimize the performance of the preamplifier.

20 Claims, 7 Drawing Sheets

PREAMPLIFIER SYSTEM WITH SELECTABLE INPUT IMPEDANCE

TECHNICAL FIELD

The present invention relates to electrical circuits and more particularly to systems and methods to provide a preamplifier with a selectable input impedance.

BACKGROUND OF INVENTION

Preamplifier circuits are used in numerous applications. Typically, a preamplifier is used in an electronic system to increase the amplitude of a weak signal created within the electronic system. A singled ended preamplifier amplifies a single ended input signal by a gain factor such that the output signal is equal to the input signal multiplied by the gain factor. Differential preamplifiers are a particular type of preamplifier wherein the differential input signal comprises a positive rail component and a negative rail component. The preamplifier increases the amplitude of both input signal components by a gain factor. The ability of the output signal of a preamplifier circuit to faithfully reproduce the input signal is a function of many factors, including among other factors, the bandwidth of the preamplifier, the frequency of the input signal, the impedance of the input system and transmission line impedance that provides the input signal, and the input impedance of the preamplifier.

In order to obtain a relatively constant gain over the specified bandwidth of a preamplifier, it is desirable to match the input impedance of the preamplifier and the impedance of the input system and transmission line impedance that provides the input signal to preamplifier. If a significant mismatch exists between the input impedance of the preamplifier and the system providing the input signal, signal reflections at the input to the preamplifier, caused by the impedance mismatch, will compromise the performance of the preamplifier. In such a situation, the output signal will be degraded or noisy at signal transitions, consequently narrowing the bandwidth over which the system can effectively operate.

The impedance of the system providing the input signal can vary significantly according to the particular system and application. In a disk drive system, the electrical resistance of a magneto-resistive (MR) head changes in response to variations in magnetic flux. The MR head is moved over the surface of a disk in order to read the data stored on the disk. The MR head reads data from a disk by sensing flux changes (e.g., changes in polarity) on the magnetic surface of an associated disk as the magnetic surface passes beneath the MR head. The flux change causes a change in the resistance of the MR head. As a function of the change in resistance, the MR head provides a corresponding change in voltage. This voltage is provided to the input of a differential preamplifier which amplifies the signal for use by other components in the system.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides systems and methods for providing a preamplifier with a selectable input impedance capable of being selected to closely match the impedance of the system providing the input signal. In order to obtain the desired flat response over the maximum bandwidth of the preamplifier, the input impedance of the preamplifier should match the impedance of the system including any transmission line impedance that provides the input signal to the preamplifier. Impedance mismatches result in signal reflections that compromise the performance of the system including the preamplifier. In some applications, the impedance of the system providing the input signal can vary. Therefore, optimal performance of the system is provided by changing the input impedance of the preamplifier in accordance with the change in impedance in the system providing the input signal.

In accordance with one aspect of the present invention, a preamplifier is provided with a selectable input impedance that is easily alterable among a set of input impedances suitable for the particular application. The input impedance of a preamplifier system is determined in part by the value of resistors in the feedback path. A feedback path exists between a negative rail output signal component and a positive rail input signal component, and also between a positive rail output signal component and a negative rail input signal component.

In one aspect of the invention, multiple feedback paths are provided that are selectable through switches that switch given feedback paths with different value resistors "IN" or "OUT" of the feedback path. Resistors may be switched "IN" or "OUT" individually, or in parallel with other resistors by selecting the appropriate feedback paths. By selecting a given set of feedback paths with their associated resistors, the input impedance of the preamplifier system can be modified. In another aspect of the invention, a selection control mechanism is provided to control the "ON" and "OFF" state of the switches which switch feedback paths "IN" or "OUT". According to one aspect of the invention, the selection control mechanism is a serial port and associated control circuitry.

DETAILED DESCRIPTION OF THE INVENTION

The present invention provides systems and methods for providing a preamplifier with a selectable input impedance capable of being selected to match the impedance of an input system that provides the input signal to the preamplifier. The input impedance of the preamplifier may be set or programmed in various ways to match the impedance of the particular system that provides the input signal to the preamplifier. Multiple feedback paths are provided that are selectable by switches to configure the preamplifier to the desired input impedance. The addition of a serial port provides a selection control mechanism to allow the preamplifier to be configured and reconfigured to different input impedance values.

Figure 1:
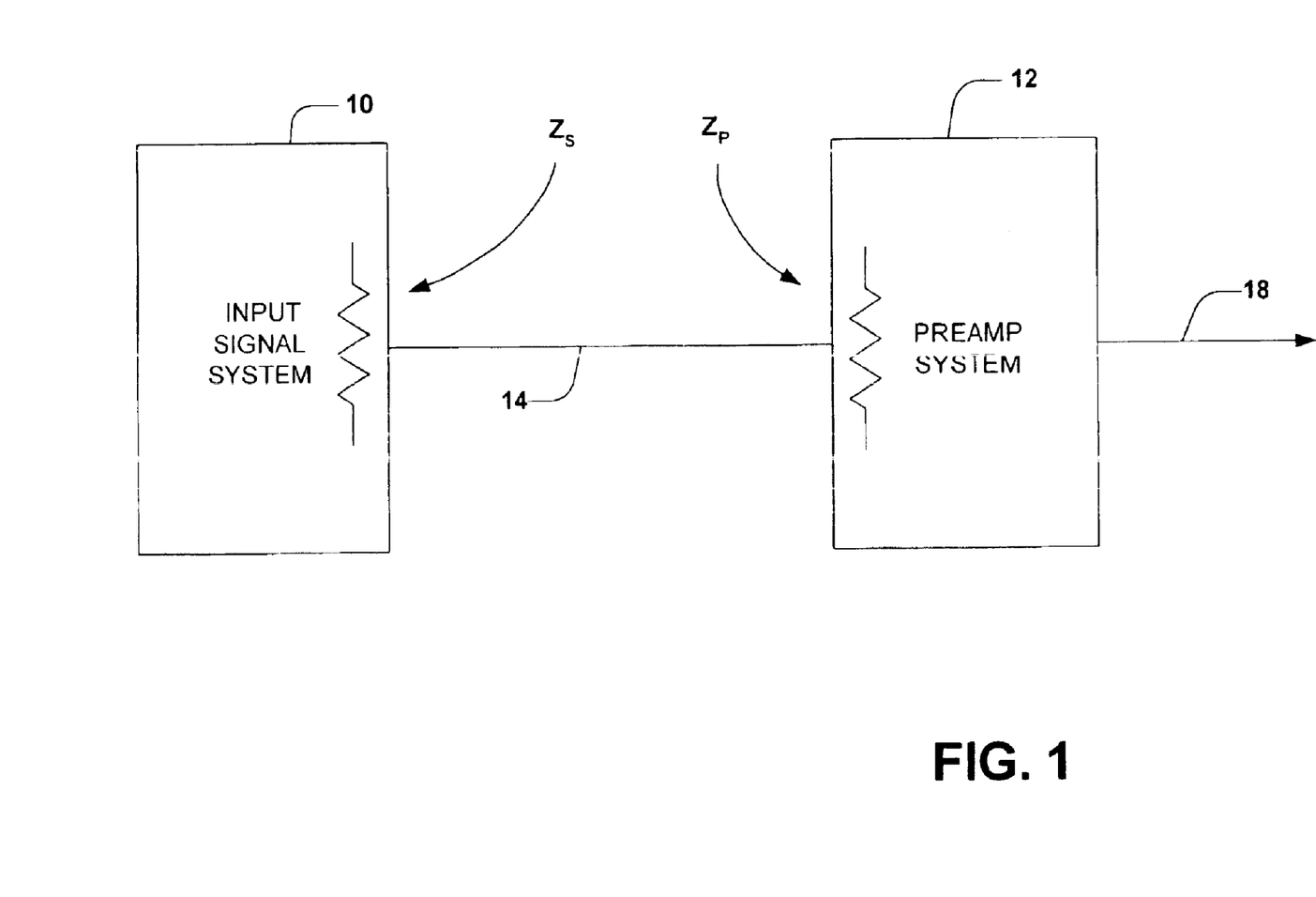
FIG. 1 illustrates a schematic block diagram of an input system coupled to a preamplifier system in accordance with an aspect of the present invention.

FIG. 1 illustrates a schematic block diagram of an input signal system 10 coupled to a preamplifier system 12 by transmission lines 14. The input signal system 10 is representative of any system that generates a signal that needs to be amplified. One such example is a magneto-resistive (MR) head utilized in disk drive systems. The output of the input signal system 10 is a signal that is input to the preamplifier system 12. The preamplifier system 12 can be comprised of one or more stages. However, the first stage is the only stage that has an effect on the input impedance of the preamplifier system 12. Transmission lines 14 transmit the output signal from the input signal system 10 to the preamplifier system 12. The impedance of the input signal system 10, including the impedance associated with the transmission lines 14, as seen by the preamplifier 12, is $Z_S$. In order to obtain a relatively constant gain over the specified bandwidth of a preamplifier, it is desirable to match the input impedance $Z_P$ of the preamplifier 12 to the impedance $Z_S$ of the input signal system 10. Properly matching $Z_P$ to $Z_S$ allows the output signal 18 of the preamplifier to relatively accurately replicate the input signal, amplified by a gain factor of the preamplifier system 12 over the specified bandwidth of the preamplifier.

Figure 2:
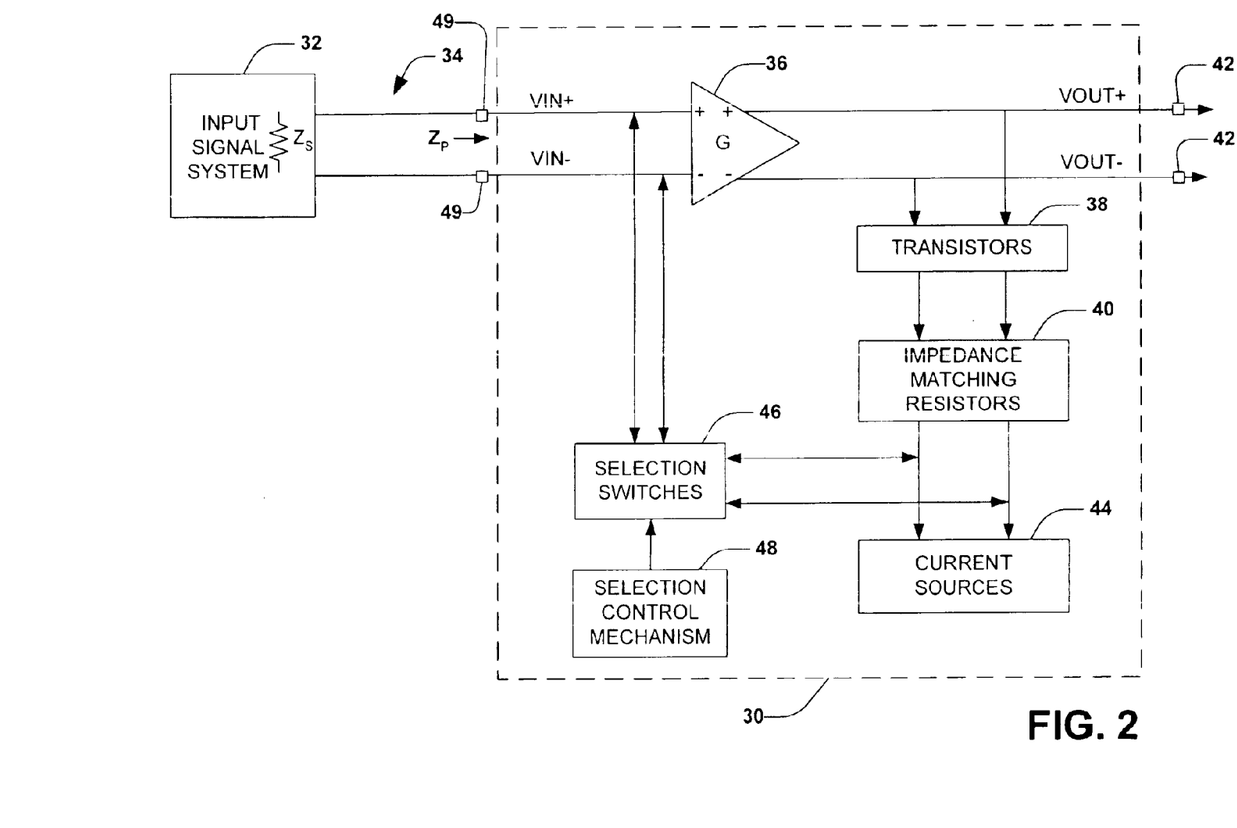
FIG. 2 illustrates a schematic block diagram of a differential preamplifier system with a selectable input impedance in accordance with an aspect of the present invention.

FIG. 2 illustrates a schematic block diagram of a differential preamplifier system 30 with a selectable input impedance in accordance with an aspect of the present invention. The differential preamplifier system 30 is illustrated as having a single stage, however, multiple stages can be coupled to the single stage for a variety of different preamplifier configurations. FIG. 2 further illustrates the coupling of the differential preamplifier system 30 to an input signal system 32 by transmission lines 34. $Z_S$ represents the impedance of the input signal system 32, including the impedance associated with the transmission lines 34, as seen by the differential preamplifier system 30. $Z_P$ represents the input impedance of the signal input of the differential preamplifier system 30. As discussed earlier, in order to obtain the optimal performance of the preamplifier system 30, it is desirable that $Z_P$ be approximately equal to $Z_S$. As $Z_S$ will vary from application to application, and can also vary over time within a given application, the preamplifier system 30 provides a circuit and method to select $Z_P$ from a given set of impedance values.

The preamplifier system 30 comprises an amplifier circuit 36, a plurality of transistors 38, a plurality of impedance matching resistors 40, a plurality of current sources 44, a plurality of selection switches 46 and a selection control mechanism 48. The preamplifier system 30 receives a differential input signal comprised of a positive rail component VIN+ and a negative rail component VIN−. The preamplifier system 30 provides an amplified differential output signal comprised of positive rail component VOUT+ and a negative rail component VOUT−. The amplifier circuit 36 amplifies input signals VIN+ and VIN− by a gain factor G, such that:

$$(VOUT+)-(VOUT-)=G*((VIN+)-(VIN-)) \qquad \text{EQ. 1}$$

The amplifier circuit 36 is coupled to the plurality of transistors 38 and output terminals 42. The output signal components, VOUT+ and VOUT− are each coupled to one or more transistors 38. Each transistor is coupled to an impedance matching resistor from the plurality of impedance matching resistors 40. A resistor is further coupled to a current source of the plurality of current sources 44. The selection switches 46 are coupled to the common nodes between the impedance matching resistors 40 and the current sources 44. The selection switches 46 provide for negative feedback across amplifier circuit 36 by completing the feedback through one or more impedance matching resistors 40. The selection control mechanism 48 determines the selection of the impedance matching resistor by turning the desired selection switches "ON" or "OFF".

The input impedance $Z_P$ of the preamplifier system 30 as seen at the input terminals 49 is a function of the selected impedance matching resistors. By turning the appropriate selection switches 46 "ON" or "OFF", the desired feedback paths comprising the desired impedance matching resistors 40 are selected and the input impedance $Z_P$ of preamplifier system 30 can be configured to approximately match the impedance $Z_S$ of the input signal system 32 including the impedance associated with the transmission lines 34.

Figure 3:
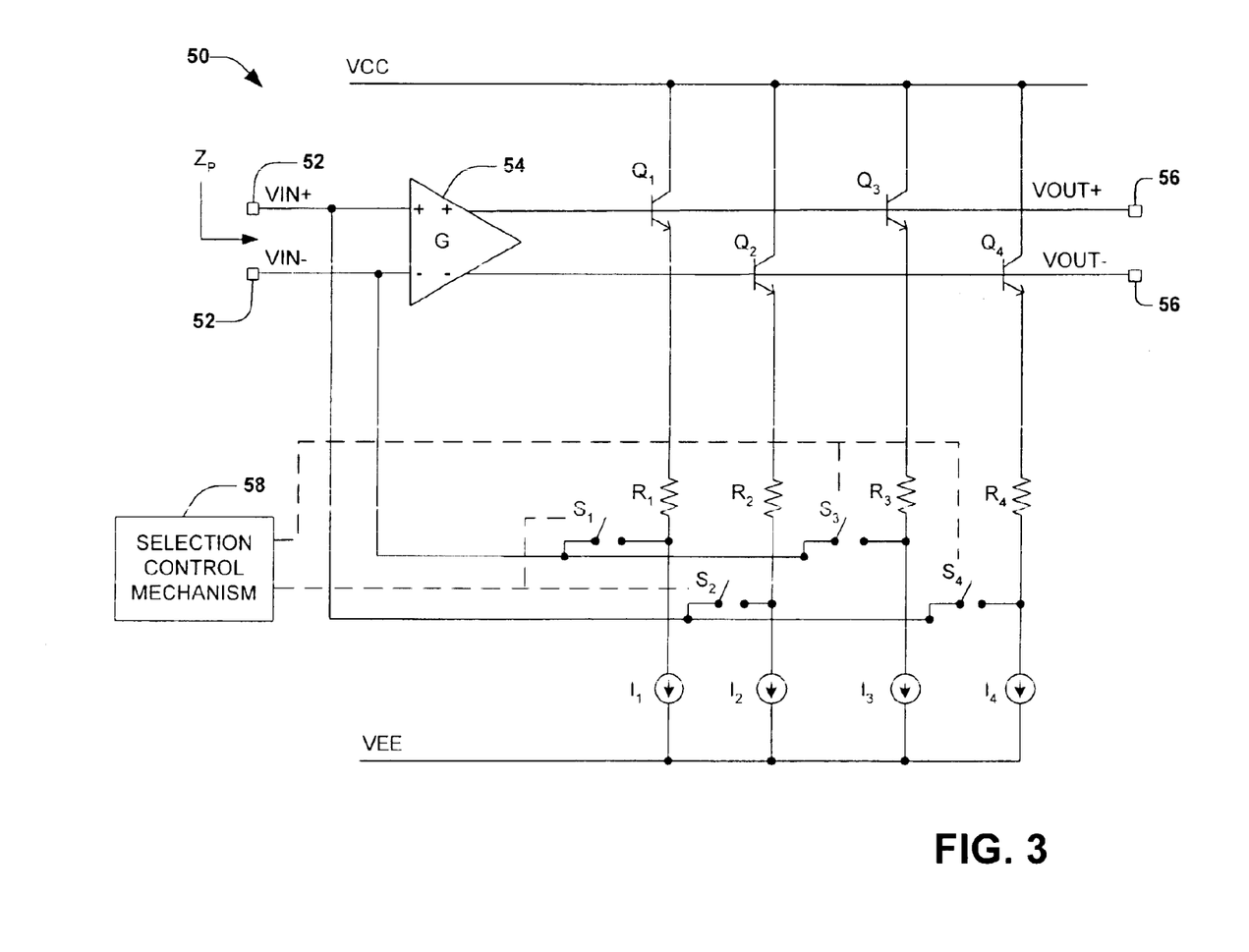
FIG. 3 is a schematic diagram of a differential preamplifier system with a selectable input impedance in accordance with an aspect of the present invention.

FIG. 3 illustrates a schematic diagram of a preamplifier system 50 with a selectable input impedance in accordance with an aspect of the present invention. $Z_S$ represents the impedance of the input system (not shown), including any impedance due to the transmission lines, that provides the differential input signal components VIN+ and VIN− to the preamplifier system 50. $Z_P$ represents the input impedance of the preamplifier system 50 as seen at the differential input terminals 52. The preamplifier system 50 can be configured to provide different input impedance levels at the input terminals 52 such that $Z_P$ can be matched to $Z_S$.

Input signal components VIN+ and VIN− are coupled to an amplifier circuit 54 which amplifies the input signal components by a factor of G. The amplifier circuit 54 provides amplified differential output signal components VOUT+ and VOUT− to output terminals 56. Negative feedback is provided from VOUT+ to VIN− and from VOUT− to VIN+ through one or more negative feedback paths via transistors, impedance matching resistors, current sources, and switches. The switch settings determine which feedback path is active, and thus, determine which impedance matching resistors are seen at the input terminals 52.

The output signal component VOUT+ is coupled to the base of a transistor $Q_1$. The collector of transistor $Q_1$ is coupled to VCC and the emitter is coupled to resistor $R_1$. The other end of $R_1$ is coupled to switch Si and current source $I_1$. $I_1$ is further coupled to voltage reference VEE. Negative feedback is provided across amplifier circuit G by closing switch $S_1$ which couples the common node between $R_1$ and $I_1$ to VIN−. In a similar fashion, the output signal component VOUT− is coupled to the base of a transistor $Q_2$. The collector of transistor $Q_2$ is coupled to VCC and the emitter is coupled to a resistor $R_2$. The other end of $R_2$ is coupled to a switch $S_2$ and a current source $I_2$. The current source $I_2$ is further coupled to a voltage reference VEE. Negative feedback is provided across the amplifier circuit 54 by closing the switch $S_2$ which couples the common node between $R_2$ and $I_2$ to VIN+.

Output signal components VOUT+ and VOUT− are each coupled to an alternative feedback path via transistors, impedance matching resistors, current sources, and switches. It is understood that one or more alternative feedback paths may be implemented. In addition to being coupled to the transistor $Q_1$, output signal component VOUT+ is also coupled to the base of a transistor $Q_3$. The collector of transistor $Q_3$ is coupled to VCC and the emitter is coupled to a resistor $R_3$. The other end of $R_3$ is coupled to switch $S_3$ and current source 13. The current source 13 is further coupled to voltage reference VEE. Negative feedback is provided across amplifier circuit 54 by closing the switch $S_3$ which couples the common node between $R_3$ and $I_3$ to VIN−. Similarly, in addition to being coupled to the transistor $Q_2$, the output signal component VOUT−, is also coupled to the base of a transistor $Q_4$. The collector of transistor $Q_4$ is coupled to VCC and the emitter is coupled to a resistor $R_4$. The other end of $R_4$ is coupled to switch $S_4$ and a current source $I_4$. The current source $I_4$ is further coupled to the voltage reference VEE. Negative feedback is provided across amplifier circuit 54 by closing switch $S_4$ which couples the common node between $R_4$ and $I_4$ to VIN+.

Selection control mechanism 58 controls the selection switches $S_1$ and $S_2$ such that switches $S_1$ and $S_2$ are either both in an open state or both in a closed state. Similarly, selection control mechanism 58 controls the selection switches $S_3$ and $S_4$ such that the switches $S_3$ and $S_4$ are either both in an open state or both in a closed state. Furthermore, $S_1$ and $S_2$ operate independently from $S_3$ and $S_4$. TABLE 1 identifies the possible switch configurations for $S_1$, $S_2$, $S_3$, and $S_4$.

TABLE 1

| Switch Configuration | $S_1$ | $S_2$ | $S_3$ | $S_4$ |
| --- | --- | --- | --- | --- |
| 1 | CLOSED | CLOSED | OPEN | OPEN |
| 2 | OPEN | OPEN | CLOSED | CLOSED |
| 3 | CLOSED | CLOSED | CLOSED | CLOSED |
| 4 | OPEN | OPEN | OPEN | OPEN |

In switch configuration 1, $S_1$ and $S_2$ are closed and $S_3$ and $S_4$ are open. In this configuration, negative feedback is provided through the transistor $Q_1$, the resistor $R_1$ and the switch $S_1$ to the negative input signal component VIN− and through the transistor $Q_2$, the resistor $R_2$ and the switch $S_2$ to the positive input signal component VIN+. In order to maintain proper operation of the input signal system, the common mode voltage ($V_{CM}$) of the input signal system as presented to the preamplifier input terminals 52 should remain unaffected by the negative feedback selection. This places some restrictions on the resistor $R_1$ and $R_2$ and on the current sources $I_1$ and $I_2$. For $R_1$ equal to $R_2$, $I_1$ and $I_2$ should be equal. In this instance, the voltage drop across $R_1$ will be substantially equal to the voltage drop across $R_2$. $I_1$ and $I_2$ are selected such that the voltage drop across $R_1$ and $R_2$ will be relatively small and not significantly influence $V_{CM}$. In this configuration, the input impedance $Z_{P1}$ at the input terminals 52 of preamplifier 50 is:

$$Z_{P1} = R_1/G \qquad \text{EQ. 2}$$

In switch configuration 2, $S_3$ and $S_4$ are closed and $S_1$ and $S_2$ are open. In this configuration, negative feedback is provided through the transistor $Q_3$, the resistor $R_3$ and switch $S_3$ to the negative input signal component VIN− and through the transistor $Q_4$, the resistor $R_4$ and the switch $S_4$ to the positive input signal component VIN+. Again, in order to maintain proper operation of the input signal system, the common mode voltage $V_{CM}$ of the input signal system as presented to the preamplifier input terminals 52 should not be affected by the selected negative feedback. This places the restrictions on the resistors $R_3$ and $R_4$ and on the current sources $I_3$ and $I_4$. For $R_3$ equal to $R_4$, $I_3$ and $I_4$ should be equal. In this instance, the voltage drop across $R_3$ will be approximately equal to the voltage drop across $R_4$. $I_3$ and $I_4$ are selected such that the voltage drop across $R_3$ and $R_4$ will be small and not significantly influence $V_{CM}$. In this configuration, the input impedance $Z_{P2}$ at the input terminals 52 of preamplifier 50 is:

$$Z_{P2} = R_3/G \qquad \text{EQ. 3}$$

In order for Vcm to be unchanged regardless of which feedback path is selected by the switch configurations, the voltage drop across resistors $R_3$ and $R_4$ should be approximately equal to each other, and also approximately equal to the voltage drop across resistors $R_1$ and $R_2$ when switch configuration 1 is selected. Therefore, $R_1=R_2$; $R_3=R_4$; $I_1*R_1=I_3*R_3$; $I_2*R_2=I_4*R_4$; $I_1=I_2$; and $I_3=I_4$.

Switch configuration 3 closes all four switches resulting in $R_1$ being in parallel with $R_3$, and $R_2$ being in parallel with $R_4$. This is possible since the voltage drop is equal across all four resistors. In this configuration, the input impedance $Z_{P3}$ at the input terminals 52 of preamplifier 50 is:

$$Z_{P3} = [(R_1*R_3)/(R_1+R_3)]/G \qquad \text{EQ. 4}$$

In switch configuration 4, all four switches are open. In this configuration, there is no negative feedback at the input terminal of the preamplifier and no resistor is across the amplifier circuit 54. The input impedance at the input terminals 52 is a function of the amplifier circuit 54 and is a very large value.

As discussed above, the input impedance of preamplifier 50, as seen at the input terminals, can be selected by configuring the switches $S_1$, $S_2$, $S_3$ and $S_4$. The switch configurations determine which resistors provide negative feedback across the amplifier circuit 54, and thereby, determine the input impedance seen at the input terminals 52. By properly selecting resistor values for $R_1$, $R_2$, $R_3$ and $R_4$, current sources for $I_1$, $I_2$, $I_3$ and $I_4$ and selecting the proper switch configurations for $S_1$, $S_2$, $S_3$ and $S_4$, the input impedance of the preamplifier system 50 can be matched to the impedance of the input signal system.

It is understood that any number of negative feedback paths can be implemented to provide for one or more input impedance values. For example, if three feedback paths are provided comprising resistors R10, R11 and R12 respectively, then eight different input impedance values may be selected based on the resistors selections as follows: R10, R11, R12, R10 in parallel with R11, R10 in parallel with R12, R11 in parallel with R12, R10 in parallel with R11 in parallel with R12, and no resistor selected.

According to one aspect of the present invention, selection switches $S_1$, $S_2$, $S_3$, $S_4$ are N-type MOSFET devices. It is understood that the selection switches may be implemented in a variety of ways. For example, instead of N-type MOSFET devices, P-type MOSFET devices, switching BJT transistors, and other methods well known to those in the art may be implemented.

According to another aspect of the present invention, the selection control mechanism 48 comprises circuitry that is electrically alterable by a serial port connection. The selection control circuitry provides control lines coupled to the gates of the MOSFET devices to turn the selection switches "ON" or "OFF" to invoke the appropriate impedance matching resistors. It is also understood that the selection control circuitry can be implemented in a variety of ways well known to those in the state of the art. For example, the selection control circuitry can be the output of a read-only-memory or a random access memory where different memory addresses are programmed with different information and the output of the memory is utilized to control the "on" or "OFF" state of the switches. Other similar methods are also possible.

According to another aspect of the invention, the selection control circuitry and the selection switches may be implemented in a common device such as jumpers, microswitches or fuses. With jumpers, the selection control is provided by either including or excluding a jumper wire. The presence of a jumper wire completes the circuit (functionally equivalent to closing a switch or turning a switch "ON") and the absence of the jumper opens the circuit (functionally equivalent to opening a switch or turning a switch "OFF"). A similar implementation with programmable fuse links completes the circuit unless the fuse is "blown" to open the circuit.

Figure 4:
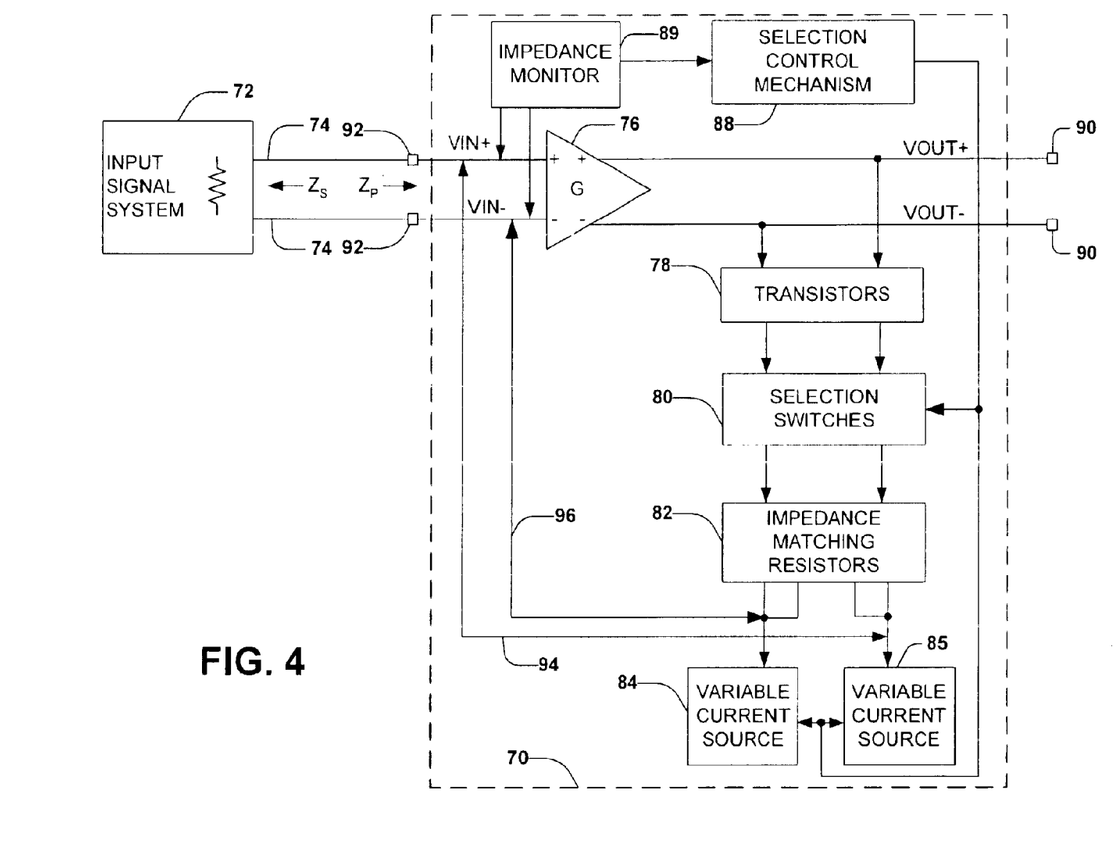
FIG. 4 illustrates a schematic block diagram of an alternate differential preamplifier system with a selectable input impedance in accordance with an aspect of the present invention.

FIG. 4 illustrates a schematic block diagram of an alternate differential preamplifier system 70 with a selectable input impedance in accordance with an aspect of the present invention. FIG. 4 further illustrates the coupling of the differential preamplifier system 70 to an input signal system 72 by transmission lines 74. $Z_S$ represents the impedance of the input signal system 72, including the impedance associated with the transmission lines 74, as seen by the differential preamplifier system 70. $Z_P$ represents the input impedance of the signal input of the differential preamplifier system 70. In order to obtain the optimal performance of preamplifier system 70, it is desirable that $Z_P$ be matched with $Z_S$. As $Z_S$ will vary from application to application and can also vary over time within a given application, preamplifier system 70 provides a circuit and method to select $Z_P$ from a given set of values.

The preamplifier system 70 comprises an amplifier circuit 76, a plurality of transistors 78, a plurality of selection switches 80, a plurality of impedance matching resistors 82, a plurality of variable current sources 84 and 85 and a selection control mechanism 88. The preamplifier system 70 receives a differential input signal comprised of a positive rail input component VIN+ and a negative rail input component VIN−. The preamplifier system 70 provides an amplified differential output signal comprised of a positive rail output component VOUT+ and a negative rail output component VOUT−. The amplifier circuit 76 amplifies the difference of the input signals VIN+ and VIN− by a gain factor G according to EQ. 1.

The output of amplifier circuit 76 is coupled to the output terminals 90. The output signal components, VOUT+ and VOUT−, from amplifier circuit 76 are each coupled to one or more of the plurality of transistors 78. A transistor is coupled to a selection switch of the plurality of selection switches 80. A selection switch is coupled to an impedance matching resistor of the plurality of impedance matching resistors 82. The impedance matching resistors are coupled to variable current sources from the respective plurality of variable current sources 84 and 85.

The current for variable current sources is based on the resistor value selected by the selection switches such that the voltage drop across the selected resistors is the same regardless of the resistor value selected. Negative feedback line 92 is coupled from VIN+ of the amplifier circuit 76 to the common node of impedance matching resistors 82 and the variable current source 85. Similarly, feedback line 94 is coupled from VIN− of amplifier circuit 76 to the common node of impedance matching resistors 82 and variable current source 84. A selection control mechanism 88 determines which resistor is switched into the feedback circuit by turning the desired selections switches "ON" or "OFF". The selection control mechanism 88 also determines the current value selected for the variable current sources 84 and 85.

The input impedance $Z_P$ as seen at the input terminals 92 is a function of the selected impedance matching resistors. By turning the appropriate selection switches 80 "ON" or "OFF" to select the desired feedback path and associated impedance matching resistors, the input impedance $Z_P$ of preamplifier system 70 can be configured to match the impedance $Z_S$ of the input signal system 72 and the transmission lines 74.

The preamplifier system 70 also includes an impedance monitor 89. The impedance monitor can be employed to dynamically monitor the impedance of the input signal system 72. If the impedance of the input signal system 72 changes, the impedance monitor can transmit this information to the selection control mechanism 88. The selection control mechanism can then alter or change the selected feedback paths so the input impedance of the preamplifier system 70 varies with changes in the input impedance of the input signal system 72.

Figure 5:
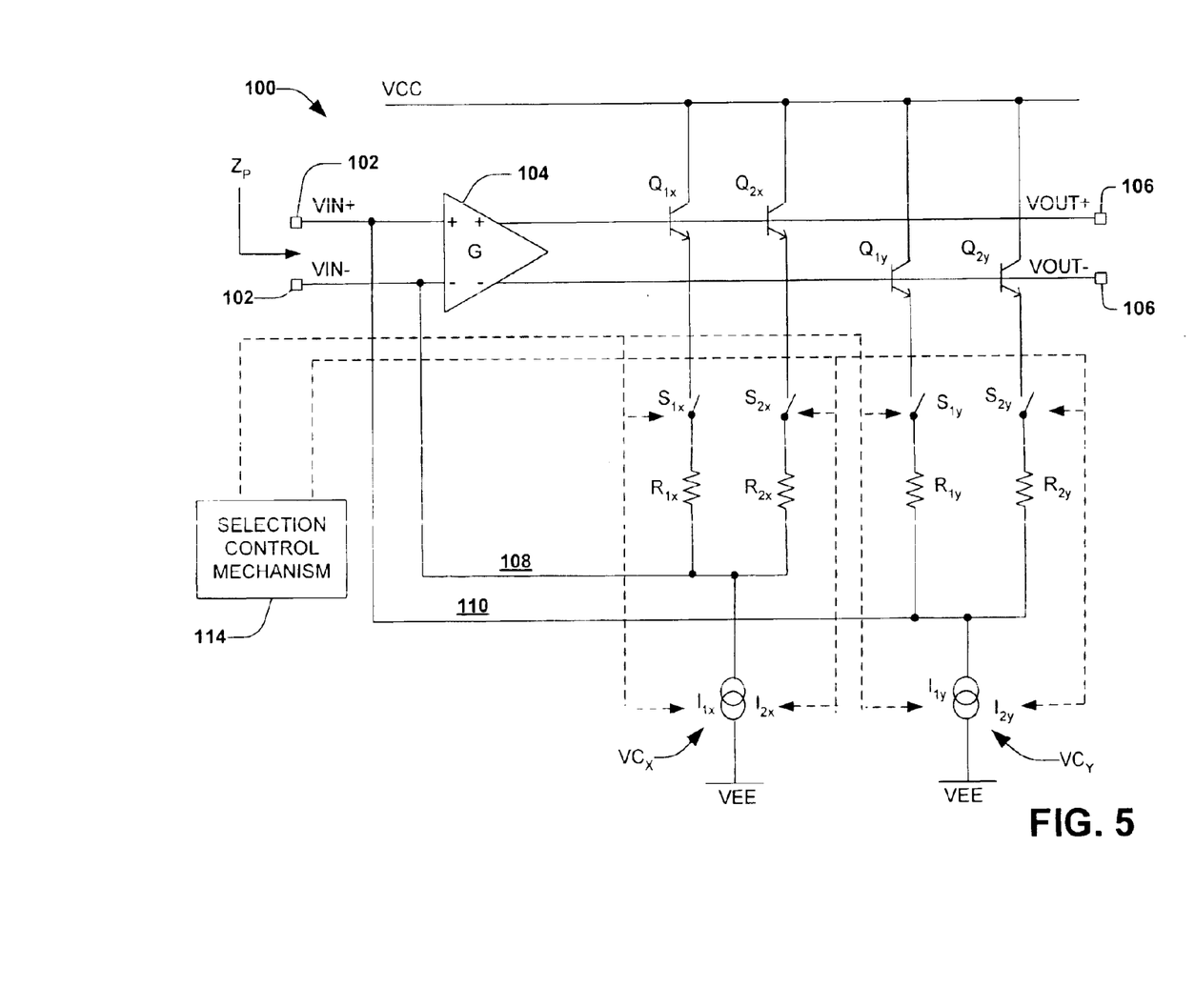
FIG. 5 is a schematic diagram of an alternate differential preamplifier system with a selectable input impedance in accordance with an aspect of the present invention.

FIG. 5 illustrates a schematic diagram of a preamplifier system 100 with selectable input impedance in accordance with an aspect of the present invention. $Z_S$ represents the impedance of the input signal system, including impedance associated with transmission lines, that provides the differential input signal components VIN+ and VIN− to the preamplifier system 100. $Z_P$ represents the input impedance of preamplifier system 100 as seen at the differential input terminals 102. As will be discussed, the preamplifier system 100 can be configured to present different input impedance levels at the input terminals 102 such that $Z_P$ can be matched to $Z_S$.

Input signal components VIN+ and VIN− are coupled to the amplifier circuit 104 which amplifies the input signal components by a factor of G. The amplifier circuit 104 provides amplified differential output signal components VOUT+ and VOUT− to the output terminals 106. Negative feedback is provided from VOUT+ to VIN− and from VOUT− to VIN+ through one or more negative feedback paths via transistors, impedance matching resistors, current sources, and switches. The switch settings determine which feedback path is active, and thereby, determine which impedance matching resistors are seen at the input terminals 102.

Output signal component VOUT+ is coupled to the base of a transistor $Q_{1x}$. The collector of transistor $Q_{1x}$ is coupled to VCC and the emitter is coupled to a switch $S_{1x}$. The other end of the switch $S_{1x}$ is coupled to a resistor $R_{1x}$. $R_{1x}$ is further coupled to a current source VCx. VCx is further coupled to a voltage reference VEE. Negative feedback line 108 couples VIN− to the common node of $R_{1x}$ and VCx. Negative feedback is provided across the amplifier circuit 104 by closing the switch $S_{1x}$ which couples $R_{1x}$ to $Q_{1x}$ and completes the feedback circuit through the feedback line 108 to VIN−.

In a similar fashion, output signal component VOUT− is coupled to the base of a transistor $Q_{1y}$. The collector of the transistor $Q_{1y}$ is coupled to VCC and the emitter is coupled to a resistor switch $S_{1y}$. The other end of the switch $S_{1y}$ is coupled to the resistor $R_{1y}$. $R_{1y}$ is further coupled to the current source VCy. VCy is further coupled to a voltage reference VEE. Negative feedback line 110 couples VIN+ to the common node $R_{1y}$ and VCy. Negative feedback is provided across amplifier circuit 104 by closing the switch $S_{1y}$ which couples $R_{1y}$ to $Q_{1y}$ and completes the feedback circuit through the feedback line 110 to VIN+.

Output signal components VOUT+ and VOUT− are each coupled to an alternative negative feedback path via transistors, impedance matching resistors, switches and current sources. It is understood that one or more alternative feedback paths may be implemented. In addition to being coupled to the transistor $Q_{1x}$ output signal component VOUT+ is also coupled to the base of the transistor $Q_2$x. The collector of the transistor $Q_{2x}$ is coupled to VCC and the emitter is coupled to the switch $S_{2x}$. The other end of $S_{2x}$ is coupled to the resistor $R_{2x}$. $R_{2x}$ is further coupled to current source VCx. VCx is further coupled to the voltage reference VEE. Negative feedback line 108 couples VIN+ to the common node $R_{2x}$ and VCx. Negative feedback is provided across amplifier circuit 104 by closing switch $S_{2x}$ which couples $R_{2x}$ to $Q_{2x}$ and completes the feedback circuit through the feedback line 108 to VIN−.

Similarly, in addition to being coupled to transistor $Q_{1y}$, output signal component VOUT−, is also coupled to the base of transistor $Q_{2y}$. The collector of transistor $Q_{2y}$ is coupled to VCC and the emitter is coupled to switch $S_{2y}$. The other end of switch $S_{2y}$ is coupled to resistor $R_{2y}$. $R_{2y}$ is further coupled to current source VCy. VCy is further coupled to voltage reference VEE. Negative feedback is provided across the amplifier circuit 104 by closing the switch $S_{2y}$ which couples $R_{2y}$ to $Q_{2y}$ and completes the feedback circuit through the feedback line 110 to VIN+.

A selection control mechanism 114 controls the selection switches $S_{1x}$ and $S_{1y}$ such that switches $S_{1x}$ and $S_{1y}$ are either both in an opened state or both in a closed state. Similarly, the selection control mechanism 114 controls the selection switches $S_{2x}$ and $S_{2y}$ such that the switches $S_{2x}$ and $S_{2y}$ are both in an opened state or both in a closed state. Furthermore, $S_{1x}$ and $S_{1y}$ operate independently from $S_{2x}$ and $S_{2y}$. TABLE 2 identifies the possible switch configurations for $S_{1x}$, $S_{1y}$, $S_{2x}$, and $S_{2y}$.

TABLE 2

| Switch Configuration | $S_{1x}$ | $S_{1y}$ | $S_{2x}$ | $S_{2y}$ |
| --- | --- | --- | --- | --- |
| 1 | CLOSED | CLOSED | OPEN | OPEN |
| 2 | OPEN | OPEN | CLOSED | CLOSED |
| 3 | CLOSED | CLOSED | CLOSED | CLOSED |
| 4 | OPEN | OPEN | OPEN | OPEN |

In switch configuration 1, $S_{1x}$ and $S_{1y}$ are closed and $S_{2x}$ and $S_{2y}$ are open. In this configuration, negative feedback is provided through the transistor $Q_{1x}$, the resistor $R_{1x}$ and the switch $S_{1x}$ to the negative input signal component VIN− and through the transistor $Q_{1y}$, the resistor $R_{1y}$ and the switch $S_{1y}$ to the positive input signal component VIN+. In order maintain proper operation of the input signal system, the common mode voltage $V_{CM}$ of the input signal system as presented to the preamplifier input terminals 102 should not be affected by the selected negative feedback. This places some restrictions on resistors $R_{1x}$ and $R_{1y}$ and on current sources VCx and VCy. For $R_{1x}$ equal to $R_{1y}$, the current $I_{1x}$ through variable current source VCx and current $I_{1y}$ through variable current source VCy should be approximately equal. In this instance, the voltage drop across $R_{1x}$ will be substantially equal to the voltage drop across $R_{1y}$. $I_{1x}$ and $I_{1y}$ are selected such that the voltage drop across $R_{1x}$ and $R_{1y}$ will be small and not significantly influence $V_{CM}$. In this configuration, the input impedance $Z_{P1}$ at the input terminals 102 of preamplifier 100 is:

$$Z_{P1}=R_{1x}/G \quad \text{EQ. 5}$$

In switch configuration 2, $S_{2x}$, $S_{2y}$ are closed and $S_{1x}$, $S_{1y}$ are open. In this configuration, negative feedback is provided through the transistor $Q_{2x}$, the resistor $R_{2x}$ and the switch $S_{2x}$ to the negative input signal component VIN− and through the transistor $Q_{2y}$, the resistor $R_{2y}$ and the switch $S_{2y}$ to the positive input signal component VIN+. Again, in order to maintain proper operation of the input signal system, the common mode voltage $V_{CM}$ of the input signal system as presented to the preamplifier input terminals 102 should not be significantly influenced by the selected feedback. This places restrictions on the resistors $R_{2x}$ and $R_{2y}$ and on the current sources VCx and VCy. For $R_{2x}$ equal to $R_{2y}$, the current $I_{2x}$ through variable current source VCx and current $I_{2y}$ through variable current source VCy should be approximately equal. In this instance, the voltage drop across $R_{2x}$ will be substantially equal to the voltage drop across $R_{2y}$. $I_{2x}$ and $I_{2y}$ are selected such that the voltage drop across $R_{2x}$ and $R_{2y}$ will be small and $V_{CM}$ will not be significantly influenced by the selected feedback path. In this configuration, the input impedance $Z_{P2}$ at the input terminals 102 of preamplifier 100 is:

$$Z_{P2}=R_{2x}/G \quad \text{EQ. 6}$$

In order for Vcm to be unchanged regardless of which input impedance is selected by the switch configuration, the voltage drop across resistors $R_{2x}$ and $R_{2y}$ should be approximately equal to each other and also approximately equal to the voltage drop across resistors $R_{1x}$ and $R_{1y}$ when switch configuration 1 is selected. Therefore, $R_{1x}=R_{1y}$; $R_{2x}=R_{2y}$; $I_{1x}*R_{1x}=I_{1y}*R_{1y}=I_{2x}*R_{2x}=I_{2y}*R_{2y}$; $I_{1x}=I_{1y}$; and $I_{2x}=I_{2y}$.

Switch configuration 3 closes all four switches resulting in $R_{1x}$ being in parallel with $R_{2x}$; and $R_{1y}$ being in parallel with $R_{2y}$. This is possible since the voltage drop is approximately equal across all four resistors. In this configuration, the input impedance $Z_{P3}$ at the input terminals 102 of preamplifier 100 is:

$$Z_{P3}=[(R_{1x}*R_{2x})/(R_{1x}+R_{2x})]/G \quad \text{EQ. 7}$$

In switch configuration 4, all four switches are open. In this configuration, there is no negative feedback at the input terminal of the preamplifier; no resistor is across the amplifier circuit 104. The input impedance at the input terminals 102 is a function of the amplifier circuit, and is a very large value.

As discussed above, the input impedance of preamplifier 100, as seen at the input terminals, can be selected by configuring the switches $S_{1x}$, $S_{2x}$, $S_{1y}$ and $S_{2y}$. The switch configurations determine which impedance matching resistors provide negative feedback across amplifier circuit 104, and thereby, determine the input impedance seen at the input terminals 102. By properly selecting resistor values for $R_{1x}$, $R_{2x}$, $R_{1y}$ and $R_{2y}$, current sources for VCx, and VCy and selecting the proper switch configurations for $S_{1x}$, $S_{2x}$, $S_{1y}$ and $S_{2y}$, the input impedance of the preamplifier system 100 can be matched to the impedance of the input signal system.

Figure 6:
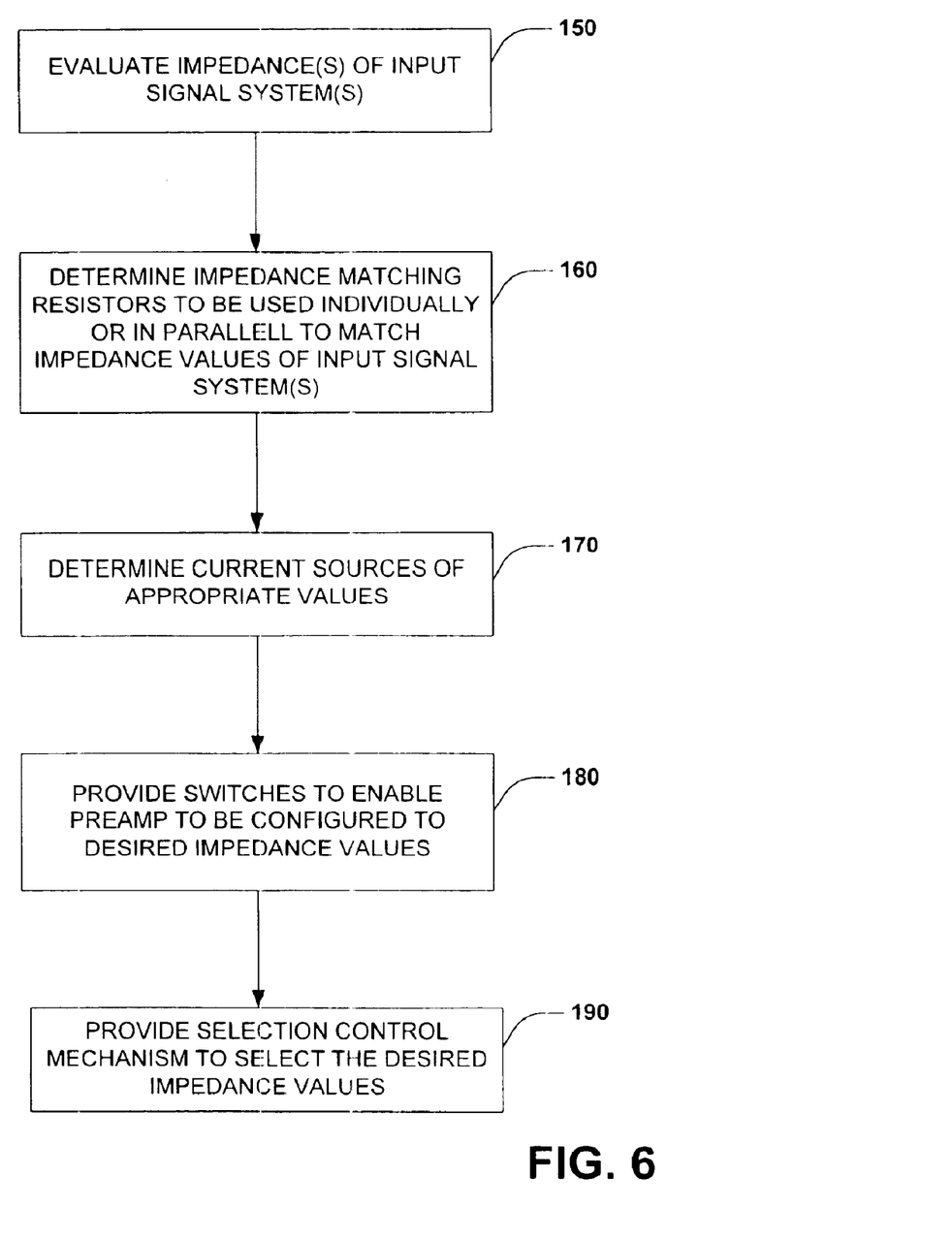
FIG. 6 illustrates a flow diagram of a methodology for providing a differential preamplifier system with a selectable input impedance in accordance with an aspect of the present invention.
Figure 7:
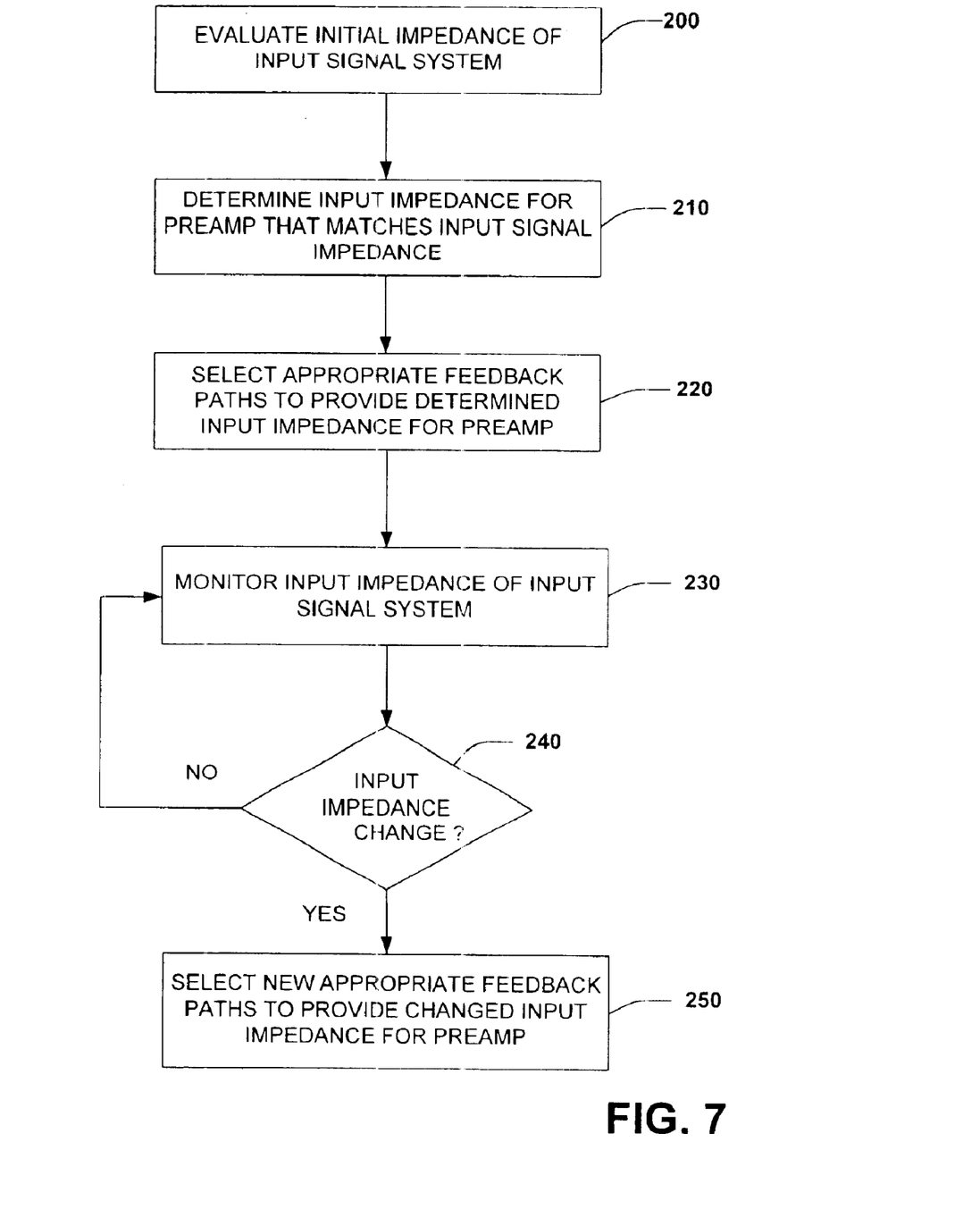
FIG. 7 illustrates a flow diagram of a methodology for the operation of a differential preamplifier system with a selectable input impedance in accordance with an aspect of the present invention.

In view of the foregoing structural and functional features described above, a methodology in accordance with various aspects of the present invention will be better appreciated with reference to FIGS. 6–7. While, for purposes of simplicity of explanation, the methodology of FIGS. 6–7 are shown and described as executing serially. It is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 6 illustrates one particular methodology for providing a preamplifier with selectable input impedance in accordance with the present invention. The methodology begins at 150 where the impedance characteristics of the input signal system are evaluated. The impedance characteristics are evaluated to determine whether they are constant, vary over time, or are selectable. One or more input signal systems may be evaluated to determine a set of impedance values that it is desirable to match. At 160, a set of impedance matching resistors is determined to match the desired set of impedance values. The impedance matching resistors can be configured to be employed individually or in parallel with other resistors to provide the desired input impedance values. At 170, current sources are determined to be used in conjunction with the resistors. The size of the current sources are determined such that when coupled to the resistors that the common mode voltage of the input signal will not be significantly altered. At 180, switches are provided to enable the resistors and current sources to be switched "in' or "OUT" of the negative feedback path across the amplifier circuitry such that the impedance at the input to the preamplifier is set. At 190, a selection control mechanism is provided.

The selection control mechanism provides for controlling the switches that switch the impedance matching resistors "IN" or "OUT" to obtain the desired negative feedback configuration and corresponding desired input impedance. The selection control mechanism can also be used to set or select the size of a variable current source. It is understood that the selection control mechanism can be implemented in a number of fashions. For example, the selection control mechanism can be a serial port coupled to control circuitry, a memory device, microswitches, a series of jumpers, or a series of fuseable links.

FIG. 7 illustrates one particular methodology for operation of a preamplifier system having a selectable input impedance in accordance with the present invention. The methodology begins at 200 where the initial input impedance characteristics of the input signal system are evaluated. At 210, a determination of the input impedance for the preamplifier that matches the input impedance of the input signal system is determined. At 220, the appropriate feedback paths are selected to provide the determined input impedance of the preamplifier. At 230, the input impedance of the input signal system is monitored. The methodology then proceeds to 240. At 240, the methodology determines if the input impedance of the input signal system has changed. If the input impedance of the input signal system has not changed (NO), the methodology returns to 230 to continue monitoring the input impedance for changes. If the input impedance of the input signal system has changed (YES), the methodology proceeds to 240. At 240, new feedback paths are selected to provide changed input impedance of the preamplifier that matches the changed input impedance of the input signal system. The methodology then returns to 230 to continue monitoring the input impedance for changes.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A preamplifier system comprising:

an amplifier having an input operative to receive an input signal provided by an input signal system having an associated input impedance including impedance due to a transmission line, the amplifier amplifies the input signal based on a gain factor associated with the amplifier to provide an output signal at an output of the amplifier;

a plurality of selectable feedback paths coupleable between the output signal and the input signal, a selected feedback path comprising at least one of the plurality of selectable feedback paths to set an input impedance of the preamplifier system; and a selection mechanism that selects the selected feedback path to match the input impedance of the preamplifier system with the associated input impedance including the impedance due to the transmission line of the input signal system.

2. A preamplifier system comprising:

an amplifier having an input operative to receive an input signal provided by an input signal system having an associated input impedance, the amplifier amplifies the input signal based on a gain factor associated with the amplifier to provide an output signal at an output of the amplifier;

a plurality of selectable feedback paths coupleable between the output signal and the input signal, a selected feedback path comprising at least one of the plurality of selectable feedback paths to set an input impedance of the preamplifier system; and a selection mechanism that selects the selected feedback path to match the input impedance of the preamplifier system with the associated input impedance of the input signal system.

wherein at least one of the plurality of selectable feedback paths comprises a transistor coupled to an output of the amplifier, an impedance matching resistor coupled to the transistor and the input of the amplifier, and a current source coupled to the resistor.

3. The preamplifier system of claim 2, the current source being a fixed current source.

4. The preamplifier system of claim 2, the current source being a variable current source.

5. The preamplifier system of claim 2, the selection mechanism comprising switches associated with a respective feedback path, the switches having an "ON " state for selecting the respective feedback path and an "OFF " state for deselecting the respective feedback path.

6. The preamplifier system of claim 5, the switches is one of a MOSFET device, a BJT transistor, a jumper, a microswitch and a fuseable link.

7. The preamplifier system of claim 1, the selection control mechanism is a serial port with control circuitry.

8. The preamplifier system of claim 1, the selection control mechanism is a memory device.

9. The preamplifier system of claim 1, the input signal and the output signal being a differential input signal and a differential output signal having associated selectable feedback paths.

10. The preamplifier system of claim 1, further comprising an impedance monitor that measures the input impedance of the input signal system and provides information to the selection mechanism for dynamically adjusting the impedance of the preamplifier system to match changes in impedance of the input signal system.

11. The preamplifier system of claim 1, the input signal system is a magneto-resistive head of a disk drive system.

12. A differential preamplifier device comprising:

a differential amplifier having a positive rail input terminal and a negative rail input terminal operative to receive a differential input signal provided by an input signal system over transmission lines, the input signal system and transmission lines having an associated input impedance including impedance due to a transmission line, the amplifier amplifies the differential input signal based on a gain factor associated with the amplifier to provide a differential output signal at a positive rail output terminal and a negative rail output terminal;

a first set of selectable feedback paths coupleable between the positive rail output terminal and the negative rail input terminal;

a second set of selectable feedback paths coupleable between the negative rail output terminal and the positive rail input terminal; and a selection mechanism that selects the selected feedback path to match the input impedance of the differential preamplifier with the associated input impedance including the impedance due to the transmission line of the input signal system and the transmission lines.

13. A differential preamplifier device comprising:

a differential amplifier having a positive rail input terminal and a negative rail input terminal operative to receive a differential input signal provided by an input signal system over transmission lines, the input signal system and transmission lines having an associated input impedance, the amplifier amplifies the differential input signal based on a gain factor associated with the amplifier to provide a differential output signal at a positive rail output terminal and a negative rail output terminal;

a first set of selectable feedback paths coupleable between the positive rail output terminal and the negative rail input terminal;

a second set of selectable feedback paths coupleable between the negative rail output terminal and the positive rail input terminal; and a selection mechanism that selects the selected feedback path to match the input impedance of the differential preamplifier with the associated input impedance of the input signal system and the transmission lines, wherein the first set of selectable feedback paths comprising a first and a second feedback path that each employ a transistor coupled the positive rail output terminal, an impedance matching resistor coupled to the transistor and the negative rail input terminal of the amplifier, the impedance matching resistor being further coupled to a current source.

14. The preamplifier device of claim 13, the second set of selectable feedback paths comprising a first and a second feedback path that each employ a transistor coupled the positive rail output terminal, an impedance matching resistor coupled to the transistor and coupleable to the negative rail input terminal of the amplifier, the impedance matching resistor being further coupled to a current source.

15. The preamplifier device of claim 14, each of the selectable feedback paths include a switch coupled to a node between the impedance matching resistor and a current source and the respective input terminal, the switch having an "ON" state for selecting the respective feedback path and an "OFF" state for deselecting the respective feedback path.

16. The preamplifier device of claim 14, each of the selectable feedback paths include a switch between the transistor and the impedance matching resistor, the switch having an "ON " state for selecting the respective feedback path and an "OFF" state for deselecting the respective feedback path.

17. The preamplifier device of claim 13, a current source is associated with each of the impedance matching resistors.

18. The preamplifier device of claim 13, a single variable current source is associated with the first set of selectable feedback paths and a second variable current source is associated with the second set of selectable feedback paths.

19. The preamplifier device of claim 13, the current value selected for the first and second current source being based on the selected feedback paths.

20. The preamplifier device of claim 13, the input signal system is a magneto-resistive head of a disk drive system.

* * * * *